`US010121772B1`

United States Patent
Wu et al.

(10) Patent No.: US 10,121,772 B1
(45) Date of Patent: Nov. 6, 2018

(54) DISPLAY APPARATUS

(71) Applicant: PlayNitride Inc., Tainan (TW)

(72) Inventors: Chih-Ling Wu, Tainan (TW); Yu-Hung Lai, Tainan (TW); Yi-Min Su, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/869,090

(22) Filed: Jan. 12, 2018

(30) Foreign Application Priority Data

Jul. 10, 2017 (TW) .............................. 106122988 A

(51) Int. Cl.
*H01L 25/16* (2006.01)
*H01L 33/62* (2010.01)
*H01L 33/54* (2010.01)
*H01L 33/42* (2010.01)
*H01L 25/075* (2006.01)
*H01L 33/20* (2010.01)

(52) U.S. Cl.
CPC ............ *H01L 25/167* (2013.01); *H01L 33/54* (2013.01); *H01L 33/62* (2013.01); *H01L 25/0753* (2013.01); *H01L 33/20* (2013.01); *H01L 33/42* (2013.01)

(58) Field of Classification Search
CPC ........ H01L 25/67; H01L 33/54; H01L 33/621
See application file for complete search history.

(56) References Cited

U.S. PATENT DOCUMENTS

| 2006/0231852 A1* | 10/2006 | Kususe | H01L 24/06 |
| | | | 257/99 |
| 2015/0021564 A1* | 1/2015 | Hong | H01L 51/5203 |
| | | | 257/40 |
| 2016/0293108 A1* | 10/2016 | Park | G09G 3/3233 |
| 2017/0047391 A1* | 2/2017 | You | H01L 27/3276 |
| 2017/0110522 A1* | 4/2017 | Lee | H01L 51/5271 |

\* cited by examiner

*Primary Examiner* — Errol Fernandes
(74) *Attorney, Agent, or Firm* — JCIPRNET

(57) ABSTRACT

A display apparatus includes a driving substrate, a plurality of light-emitting devices, and a plurality of metal common electrodes. The light-emitting devices are dispersedly disposed on the driving substrate, and each of the light-emitting devices includes an epitaxial structure and a first type electrode and a second type electrode disposed on the epitaxial structure. The metal common electrodes are dispersedly disposed on the driving substrate and in contact with a portion of the second type electrode of each of the light-emitting devices to form an ohmic contact.

15 Claims, 5 Drawing Sheets

DISPLAY APPARATUS

CROSS-REFERENCE TO RELATED APPLICATION

This application claims the priority benefit of Taiwan application serial no. 106122988, filed on Jul. 10, 2017. The entirety of the above-mentioned patent application is hereby incorporated by reference herein and made a part of this specification.

BACKGROUND OF THE INVENTION

1. Field of the Invention

The invention relates to a display apparatus. More particularly, the invention relates to a display apparatus in which the light emitting diodes act as the display pixels.

2. Description of Related Art

In a general display panel, common electrodes and light emitting diodes are both disposed in a display area, wherein the light emitting diodes are located in each pixel area and are electrically connected to the common electrodes. Along with voltage differences between the common electrodes and the light emitting diodes, a status of a display medium layer is thereby changed for performing display. Currently, during the manufacturing of the light emitting diodes, indium tin oxide (ITO) having a high work function of 4.5 eV to 5.3 eV and providing stable and light transmissive properties are selected most of the time to act as an electrode material. The existing common electrodes adopt the same material as well, meaning that the common electrodes are made of indium tin oxide (ITO). Nevertheless, an indium tin oxide (ITO) material has less extensibility and toughness, manufacturing of the common electrodes of a display panel is thus more difficult, and consequently, yield rates of the display panel are reduced.

SUMMARY OF THE INVENTION

The invention provides a display apparatus having favorable manufacturing yield rates.

A display apparatus provided by an embodiment of the invention includes a driving substrate, a plurality of light-emitting devices, and a plurality of metal common electrodes. The light-emitting devices are dispersedly disposed on the driving substrate, and each of the light-emitting devices includes an epitaxial structure and a first type electrode and a second type electrode disposed on the epitaxial structure. The metal common electrodes are dispersedly disposed on the driving substrate and in contact with a portion of the second type electrode of each of the light-emitting devices to form an ohmic contact.

In an embodiment of the invention, a specific value of ratio of a contact area of the metal common electrodes in contact with an upper surface of each of the second type electrodes to an area of the upper surface of each of the second type electrodes is less than and equal to 0.5.

In an embodiment of the invention, the metal common electrodes comprise a plurality of first type metal common electrodes and a plurality of second type metal common electrodes, wherein a material of the first type metal common electrodes is different from a material of the second type metal common electrodes.

In an embodiment of the invention, the material of the first type metal common electrodes includes gold, germanium, nickel, or an alloy combining the foregoing materials, and the material of the second type metal common electrodes includes titanium, aluminum, or an alloy combining the foregoing materials.

In an embodiment of the invention, each of the light-emitting devices that the first type metal common electrodes are correspondingly in contact with has a first dominant light-emitting wavelength, and each of the light-emitting devices that the second type metal common electrodes are correspondingly in contact with has a second dominant light-emitting wavelength. The first dominant light-emitting wavelength is greater than the second dominant light-emitting wavelength.

In an embodiment of the invention, each of the light-emitting devices that the first type metal common electrodes are correspondingly in contact with is a red light emitting device, and each of the light-emitting devices that the second type metal common electrodes are correspondingly in contact with is a blue light emitting device or a green light emitting device.

In an embodiment of the invention, the display apparatus further includes a plurality of bonding pads disposed on the driving substrate and located between the first type electrode of each of the light-emitting devices and the driving substrate.

In an embodiment of the invention, the display apparatus further includes an insulation layer disposed on the driving substrate and covering the bonding pads and the epitaxial structure and the first type electrode of each of the light-emitting devices. The metal common electrodes cover on the insulation layer. A thickness of the insulation layer is less than a thickness of each of the light-emitting devices.

In an embodiment of the invention, the epitaxial structure includes a first type semiconductor layer, a light-emitting layer, and a second type semiconductor layer. The light-emitting layer is located between the first type semiconductor layer and the second type semiconductor layer. The first type electrode is electrically connected to the first type semiconductor layer, and the second type electrode is electrically connected to the second type semiconductor layer.

In an embodiment of the invention, the metal common electrodes cover one side surface of each of the light-emitting layers.

In an embodiment of the invention, each of the metal common electrodes has a first vertical height in vertical section, and each of the metal common electrodes and the driving substrate have a second vertical height in vertical section. A specific value of ratio of the first vertical height to the second vertical height is between 0.3 and 1.

In an embodiment of the invention, the metal common electrodes cover one side surface of each of the light-emitting devices.

In an embodiment of the invention, each of the metal common electrodes includes a first metal common electrode and a second metal common electrode. The first metal common electrode and the second metal common electrode respectively cover two side surfaces of each of the light-emitting devices.

In an embodiment of the invention, the metal common electrodes cover a surrounding of each of the light-emitting devices.

In an embodiment of the invention, the display apparatus further includes a transparent conductive layer disposed on the metal common electrodes and at least covering the metal common electrodes and the light-emitting devices.

In view of the foregoing, in the display apparatus of the embodiments of the invention, as the metal common electrodes with favorable extensibility and toughness are in contact with a portion of the second type electrode of each of the light-emitting devices, and moreover, interface of high work function is provided by the metal common electrodes, efficiency of the ohmic contact is therefore enhanced. Furthermore, since the metal common electrodes cover merely a portion of the second type electrode, the light-emitting devices are thus able to maintain light output efficiency. In short, the display apparatus provided by the embodiments of the invention may have favorable device property and manufacturing yield rates.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
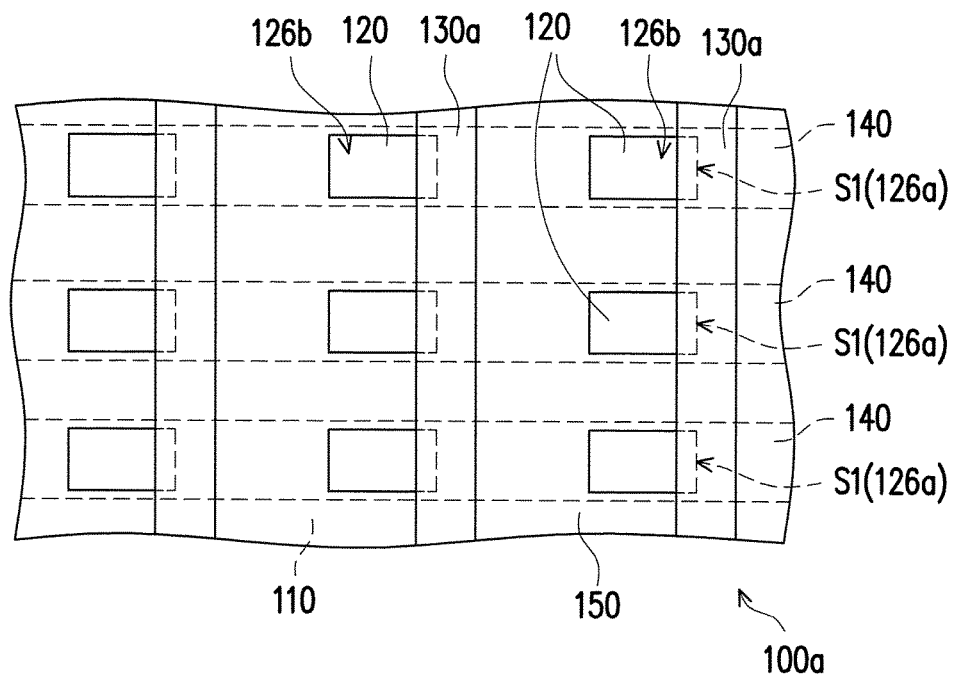
FIG. 1A illustrates a partial schematic top view of a display apparatus according to an embodiment of the invention.
Figure 1B:
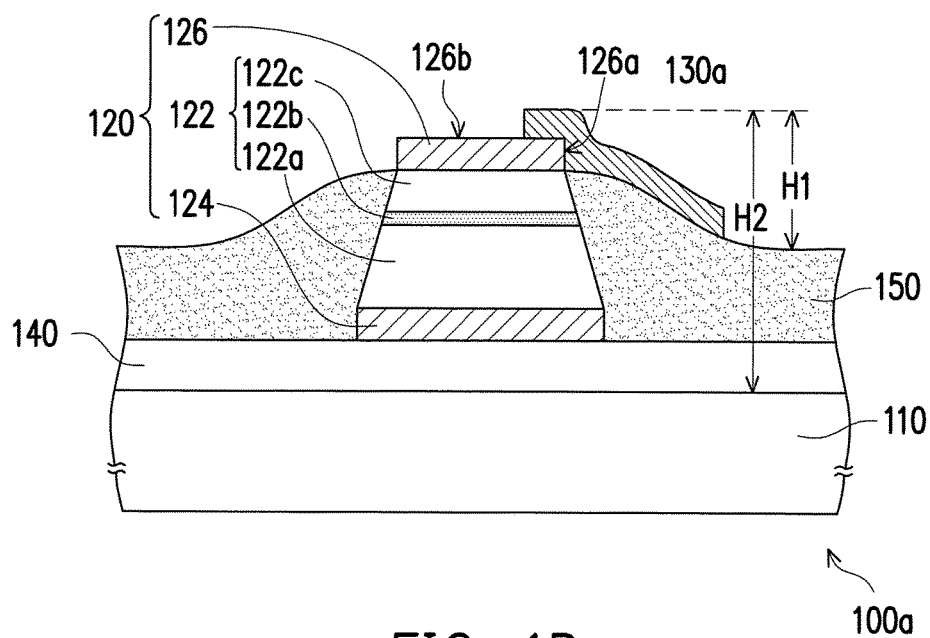
FIG. 1B illustrates a partial schematic cross-sectional view of the display apparatus of FIG. 1A.

FIG. 1A illustrates a partial schematic top view of a display apparatus according to an embodiment of the invention. FIG. 1B illustrates a partial schematic cross-sectional view of the display apparatus of FIG. 1A. Referring to FIG. 1A and FIG. 1B together, in the present embodiment, a display apparatus 100a includes a driving substrate 110, a plurality of light-emitting devices 120, and a plurality of metal common electrodes 130a. The light-emitting devices 120 are dispersedly disposed on the driving substrate 110. Each of the light-emitting devices 120 includes an epitaxial structure 122 and a first type electrode 124 and a second type electrode 126 disposed on the epitaxial structure 122. The metal common electrodes 130a are dispersedly disposed on the driving substrate 110 and in contact with a portion of the second type electrode 126 of each of the light-emitting devices 120 to form an ohmic contact.

Specifically, the driving substrate 110 of the present embodiment is, for example, a complementary metal-oxide-semiconductor (CMOS) semiconductor substrate, a liquid crystal on silicon (LCOS) substrate, a thin film transistor (TFT) substrate, or a substrate with a working circuit, but the invention is not limited thereto. The light-emitting devices 120 are dispersedly disposed on the driving substrate 110 and arranged in a matrix manner, and moreover, the light-emitting devices 120 are electrically connected to the driving substrate 110 and driven by the driving substrate 110 to emit lights. The epitaxial structure 122 of each of the light emit emitting devices 120 is implemented to include a first type semiconductor layer 122a, a light-emitting layer 122b, and a second type semiconductor layer 122c, wherein the light-emitting layer 122b is located between the first type semiconductor layer 122a and the second type semiconductor layer 122c. The first type electrode 124 and the second type electrode 126 are respectively located on two opposite sides of the epitaxial structure 122. Herein, the first type electrode 124 is electrically connected to the first type semiconductor layer 122a, and the second type electrode 126 is electrically connected to the second type semiconductor layer 122c.

As shown in FIG. 1B, the light-emitting devices 120 of the present embodiment are implemented as vertical micro light-emitting diodes (LEDs) with a maximum width approximately between 1 micron and 100 microns, and more preferably, between 3 microns and 50 microns. Herein, a cross section of the epitaxial structure 122 exhibits a positive trapezoidal shape, and an overall thickness of the epitaxial structure 122 is approximately between 1 micron and 6 microns. Herein, the first type semiconductor layer 122a is, for example, an N-type semiconductor layer, and the second type semiconductor layer 122c is, for example, a P-type semiconductor layer, but the invention is not limited thereto. A thickness of the first type semiconductor layer 122a is larger than a thickness of the second type semiconductor layer 122c. The first type electrode 124 is, for example, an N-type electrode, and the second type electrode 126 is, for example, a P-type electrode, but the invention is not limited thereto. A material of the second type electrode 126 includes a transparent conductive material or a translucent conductive material, for example, indium tin oxide (ITO) having a high work function of 4.5 eV to 5.3 eV and providing stable and light transmissive properties, as such, light generated by the light-emitting layer 122b may be outputted through the second type electrode 126. It is worth noting that the display apparatus 100a has a plurality of pixel units (not shown), wherein each of the pixel units (not shown) may include at least three light emitting devices 120 with different wavelengths, but the invention is not limited thereto.

Furthermore, the metal common electrodes 130a of the present embodiment are in contact with a portion of the second type electrode 126 of each of the light-emitting devices 120 to form an ohmic contact. Herein, a material of the metal common electrodes 130a is metal and is different from that of the second type electrode 126. In the prior art, as indium tin oxide (ITO) is adopted to serve as the material of the common electrodes, it thus can be seen that in comparison, effect of the ohmic contact of the present embodiment can be effectively enhanced. More preferably, a specific value of ratio of a contact area of the metal common electrodes 130a in contact with an upper surface 126b of each of the second type electrodes 126 to an area of the upper surface 126b of each of the second type electrodes 126 is less than and equal to 0.5. If the specific value of ratio of the two areas exceeds 0.5, light output is likely to be shielded. More preferably, when the specific value of ratio of the two areas is less than and equal to 0.25 and greater than and equal to 0.05, an overly high conductive resistance value resulted from insufficient contact area which may affect efficiency of ohmic contact is prevented, and light output efficiency is also maintained. Herein, the area of the upper surface 126b of each of the second type electrodes 126 is, for example, 8 microns×25 microns, or 7 microns×20 microns. The contact area of the metal common electrodes 130a in contact with the upper surface 126b of each of the second type electrodes 126 is, for example, 2 microns×25 microns or 1 micron×20 microns, but the invention is not limited thereto.

As shown in FIG. 1A and FIG. 1B, the metal common electrodes 130a are implemented to cover one side surface S1 of each of the light-emitting devices 120. The metal common electrode 130a is also in contact with one side surface 126a and a portion of the upper surface 126b of the second type electrode 126 simultaneously, such that the area of the metal common electrode 130a in contact with the second type electrode 126 may be increased, so as to increase current conduction efficiency. As the metal common electrode 130a exposes a portion of the upper surface 126b of the second type electrode 126 of the light emitting device 120, such that the light emitting device 120 is able to maintain light output efficiency. Materials of the metal common electrodes 130a include, for example, gold, germanium, nickel, aluminum, titanium, an alloy combining the foregoing materials, or a combination of the foregoing materials. The materials may be completely identical, completely different, or not exactly the same according to colors of light output of the light-emitting devices 120. The invention is not limited thereto.

Figure 1C:
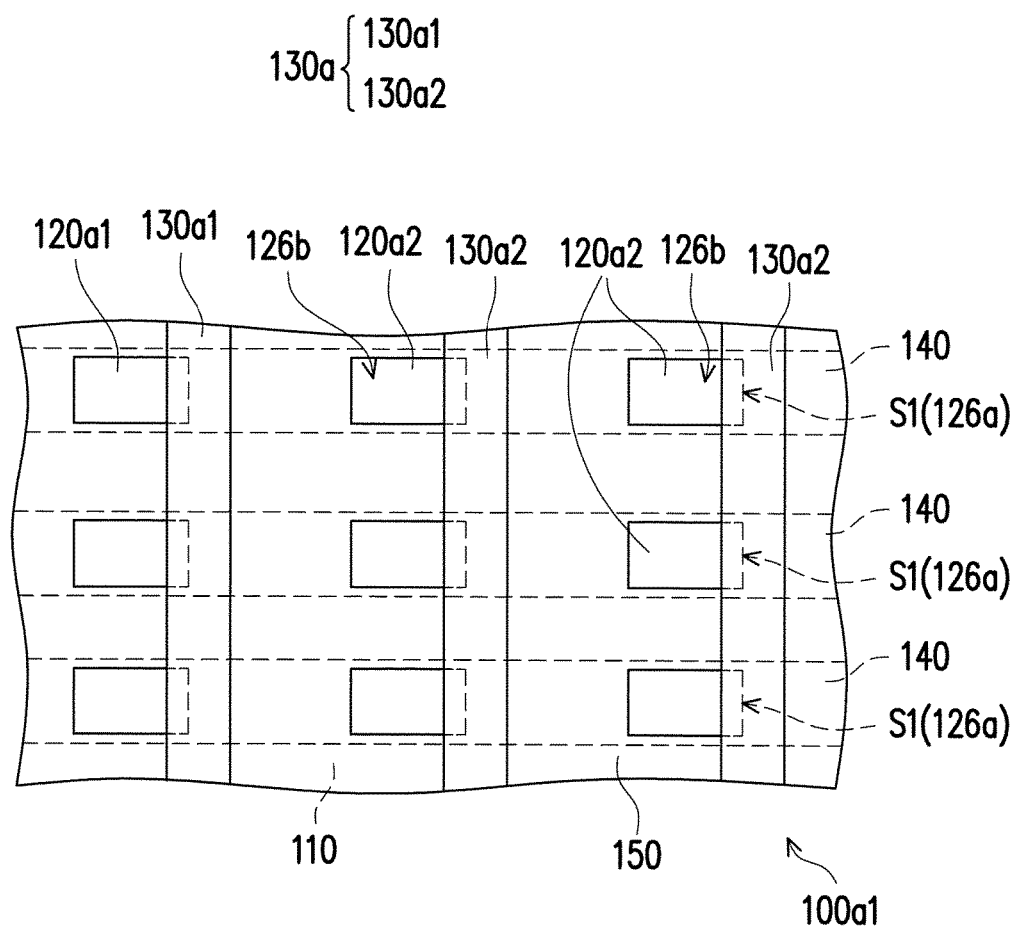
FIG. 1C illustrates a partial schematic top view of a display apparatus according to another embodiment of the invention.

In another embodiment, referring to FIG. 1C, materials of metal common electrodes 130a of a display apparatus 100a1 may be different. The metal common electrodes 130a may include a plurality of first type metal common electrodes 130a1 and a plurality of second type metal common electrodes 130a2. Materials of the first type metal common electrodes 130a1 may include gold, germanium, nickel, or an alloy of the foregoing materials. Moreover, light-emitting devices 120a1 that the first type metal common electrodes 130a are correspondingly in contact with may have a first dominant light-emitting wavelength. Materials of the second type metal common electrodes 130a2 may include titanium, aluminum, or an alloy combining the foregoing materials. Light-emitting devices 120a2 that the second type metal common electrodes 130a2 are correspondingly in contact with may have a second dominant light-emitting wavelength. Herein, the first dominant light-emitting wavelength is greater than the second dominant light-emitting wavelength. To be more specifically, the first dominant light-emitting wavelength is, for example, greater than and equal to 610 nm and less than 700 nm, meaning that the light-emitting devices 120a1 that the first type metal common electrodes 130a1 are correspondingly in contact with are red light emitting devices. The second dominant light-emitting wavelength is, for example, greater than and equal to 430 nm and less than and equal to 570 nm, meaning that the light-emitting devices 120a2 that the second type metal common electrodes 130a2 are correspondingly in contact with are blue light emitting devices or green light emitting devices. As such, compared to that in the prior art, the light-emitting devices which have different light-emitting wavelengths but are connected to the common electrodes with the same material and thus are prone to encounter problems such as unstable currents, the display apparatus provided by the embodiments of the invention is able to provide more favorable display effect.

In addition, the display apparatus 100a of the present embodiment may include a plurality of bonding pads 140. Herein, the bonding pads 140 are dispersedly disposed on the driving substrate 110 and located between the first type electrode 124 of each of the light-emitting devices 120 and the driving substrate 110, as such, each of the light-emitting devices 120 is electrically connected to the driving substrate 110 and is able to absorb stress generated when the light-emitting devices 120 are bonding to the driving substrate 110. In addition, the display apparatus 100a of the present embodiment further includes an insulation layer 150 disposed on the driving substrate 110 and covering the bonding pads 140 and the epitaxial structure 122 and the first type electrode 124 of each of the light-emitting devices 120. As such, the metal common electrodes 130a are prevented from being in contact with the light-emitting layers 122b and the first type semiconductor layers 122a which may cause short circuit and lead to malfunction of the display apparatus 100a. In other words, the metal common electrodes 130a of the present embodiment are not in direct contact with the epitaxial structure 122 of the light-emitting devices 120 and the first type electrodes 124. Particularly, a thickness of the insulation layer 150 is less than a thickness of each of the light-emitting devices 120, and the thickness of the insulation layer 150 is, for example, between 1 micron and 3 microns, and that the display apparatus 100a has a smaller volume.

Compared to the prior art in which indium tin oxide (ITO) with unfavorable material extensibility is adopted to serve as the common electrodes, the material of the metal common electrodes 130a of the present embodiment is metal with favorable extensibility, as such, the metal common electrodes 130a can crawl and cover on the insulation layer 150 and are electrically connected to the second type electrode 126 of each of the light-emitting devices 120 along the insulation layer 150. Accordingly, current conduction efficiency and manufacturing yield rates of the display apparatus 100a may be enhanced. More preferably, each of the metal common electrodes 130a has a first vertical height H1 in vertical section, and each of the metal common electrodes 130a and the driving substrate 110 have a second vertical height H2 in vertical section. A specific value of ratio of the first vertical height H1 to the second vertical height H2 is between 0.3 and 1. Herein, the second vertical height H2 is a maximum vertical height of each of the metal common electrodes 130a and the driving substrate 110 in vertical section. Preferably, a specific value of ratio of the first vertical height H1 to the second vertical height H2 is between 0.5 and 1, and that the area of the metal common electrodes 130a covering the side surfaces S1 of the light-emitting devices 120 may be increased. To be more preferably, the metal common electrodes 130a completely cover one side surface of the light-emitting layer 122b. The material of the metal common electrodes 130a of the present embodiment is metal, such that side light output emitted by the light-emitting layer 122b may be effectively reflected, and that efficiency of front light output of the light-emitting devices 120 may be increased. Herein, H1 is, for example, between 1 micron and 10 microns, and H2 is, for example, between 2 microns and 10 microns. Nevertheless, the invention is not limited thereto.

In short, in the display apparatus 100a of the present embodiment, the metal common electrodes 130a with favorable material extensibility are used to be in direct contact with a portion of the upper surface 126b of the second type electrode 126 of each of the light-emitting devices 120 to form the ohmic contact. Compared to that in the prior art, indium tin oxide (ITO) with unfavorable material extensibility adopted to serve as the material of the common electrodes, it thus can be seen that in the present embodiment, effect of the ohmic contact can be effectively enhanced. In addition, as the metal common electrodes 130a do not completely cover the upper surfaces 126b of the second type electrodes 126, the light emitting devices 120 are thus able to maintain light output efficiency.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 2A:
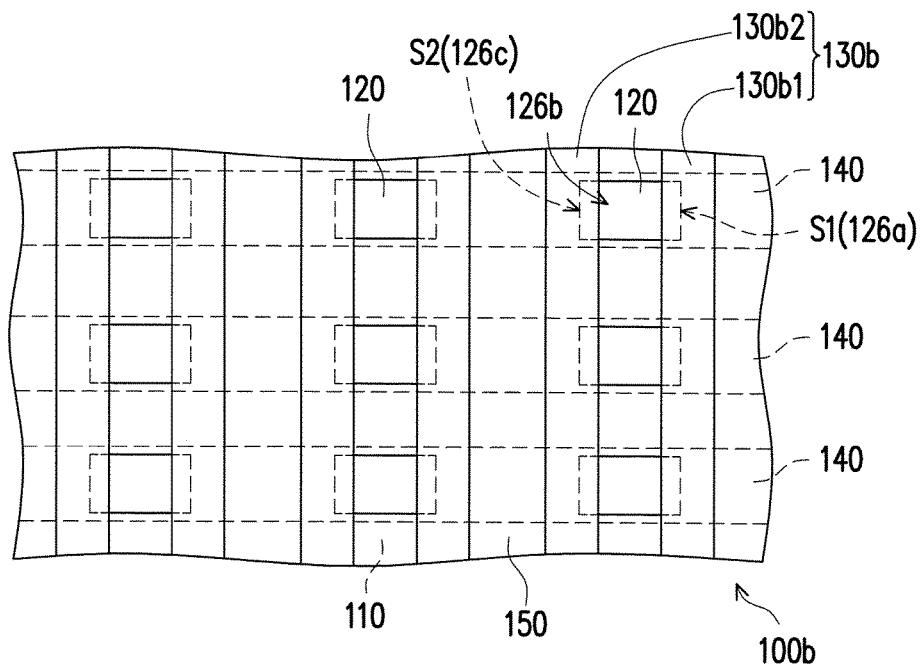
FIG. 2A illustrates a partial schematic top view of a display apparatus according to another embodiment of the invention.
Figure 2B:
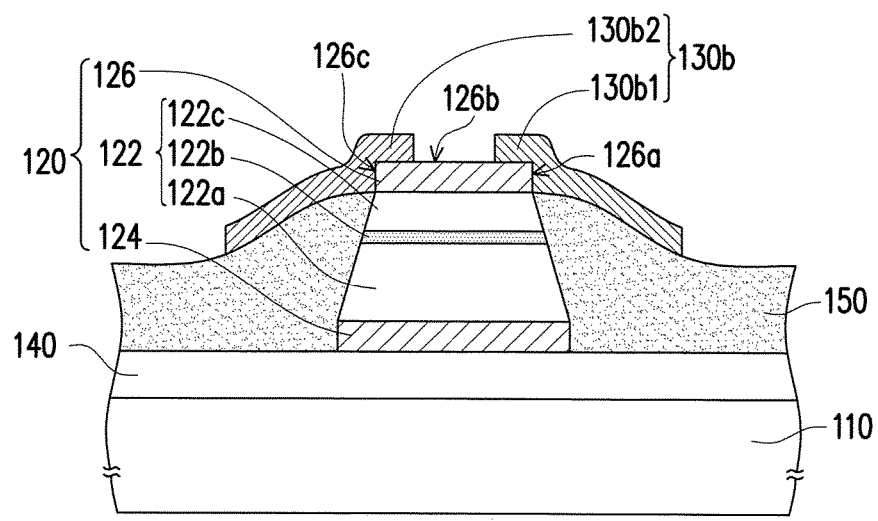
FIG. 2B illustrates a partial schematic cross-sectional view of the display apparatus of FIG. 2A.

FIG. 2A illustrates a partial schematic top view of a display apparatus according to another embodiment of the invention. FIG. 2B illustrates a partial schematic cross-sectional view of the display apparatus of FIG. 2A. Referring to FIG. 1A, FIG. 1B, FIG. 2A, and FIG. 2B together, a display apparatus 100b of the present embodiment is similar to the display apparatus 100a of FIG. 1A and FIG. 1B, but a difference therebetween is that each of metal common electrodes 130b of the present embodiment includes a first metal common electrode 130b1 and a second metal common electrode 130b2. Herein, the first metal common electrode 130b1 and the second metal common electrode 130b2 respectively cover side surfaces 126a and 126c and a portion of an upper surface 126b of the second electrode 126. In other words, the metal common electrodes 130b are implemented to cover two opposite side surfaces S1 and S2 of each of the light-emitting devices 120 and expose a portion of the upper surface 126b of the second type electrode 126 and a portion of the insulation layer 150. In an embodiment that is not shown, the first metal common electrode and the second metal common electrode respectively cover at least any two side surfaces of the second type electrode 126. Nevertheless, the invention is not limited thereto.

Figure 3:
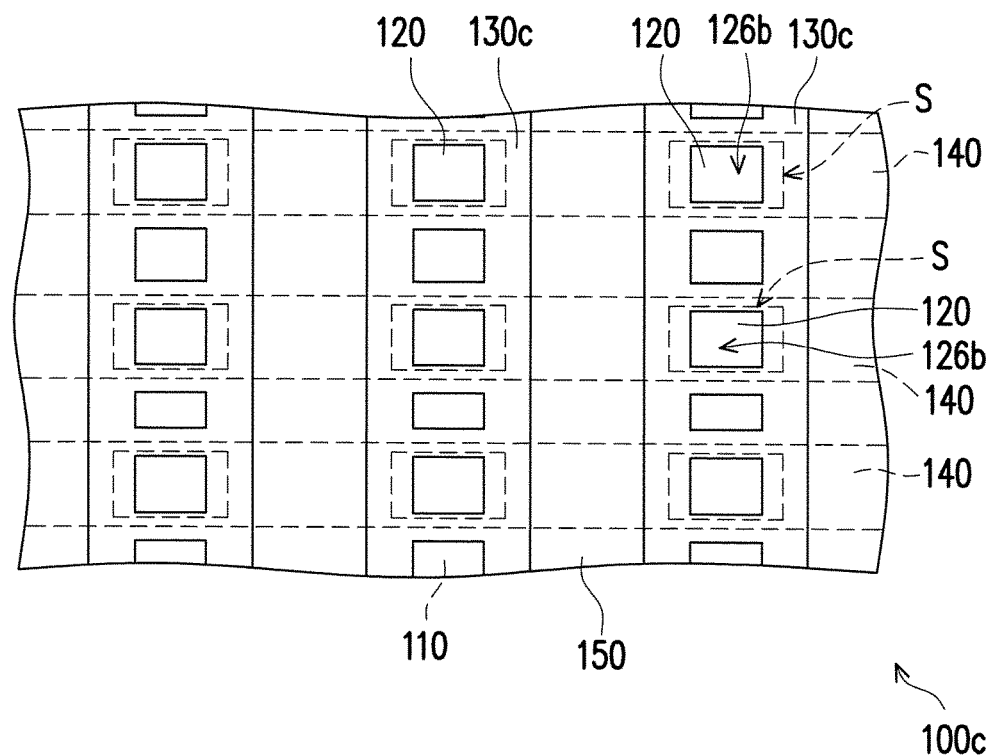
FIG. 3 illustrates a partial schematic top view of a display apparatus according to another embodiment of the invention.

FIG. 3 illustrates a partial schematic top view of a display apparatus according to another embodiment of the invention. Referring to FIG. 1A and FIG. 3 together, a display apparatus 100c of the present embodiment is similar to the display apparatus 100a of FIG. 1A, but a difference therebetween is that metal common electrodes 130c of the present embodiment are implemented to cover a surrounding S of each of the light-emitting devices 120 and expose a portion of the upper surface 126b of the second type electrode 126 and the insulation layer 150.

Figure 4:
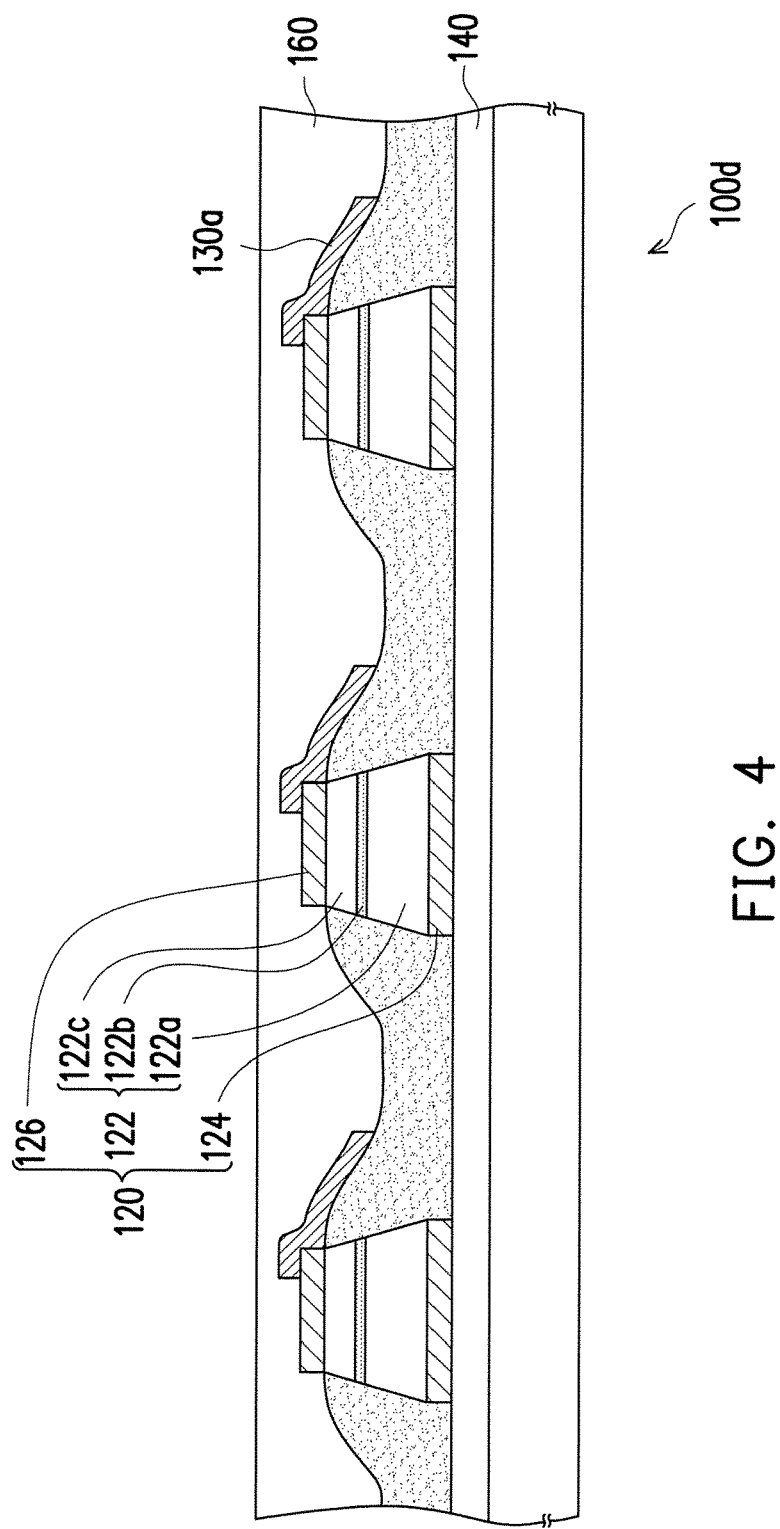
FIG. 4 illustrates a partial schematic cross-sectional view of a display apparatus according to another embodiment of the invention.

FIG. 4 illustrates a partial schematic cross-sectional view of a display apparatus according to another embodiment of the invention. Referring to FIG. 1B and FIG. 4 together, a display apparatus 100d of the present embodiment is similar to the display apparatus 100a of FIG. 1B, but a difference therebetween is that a transparent conductive layer 160 is further included in display apparatus 100d of the present embodiment and disposed on the metal common electrodes 130a and covers at least the metal common electrodes 130a and the light-emitting devices 120. Herein, the transparent conductive layer 160 is disposed with a purpose to enable currents to be conducted evenly and to protect the metal common electrodes 130a and the light-emitting devices 120 and is furthermore conducive to improving light output efficiency of the light-emitting devices 120.

In view of the foregoing, in the display apparatus of the embodiments of the invention, as the metal common electrodes with favorable extensibility and toughness are in contact with a portion of the second type electrode of each of the light-emitting devices to form the ohmic contact, and moreover, interface of high work function is provided by the metal common electrodes, efficiency of the ohmic contact is therefore enhanced. Furthermore, since the metal common electrodes cover merely a portion of the second type electrode, the light-emitting devices are thus able to maintain light output efficiency. In short, the display apparatus provided by the embodiments of the invention may have favorable device property and manufacturing yield rates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display apparatus, comprising:
    a driving substrate;
    a plurality of light-emitting devices dispersedly disposed on the driving substrate, each of the light-emitting devices comprising an epitaxial structure and a first type electrode and a second type electrode disposed on the epitaxial structure; and
    a plurality of metal common electrodes dispersedly disposed on the driving substrate and being in contact with a portion of the second type electrode of each of the light-emitting devices to form an ohmic contact.

2. The display apparatus as claimed in claim 1, wherein a specific value of ratio of a contact area of the metal common electrodes in contact with an upper surface of each of the second type electrodes to the area of the upper surface of each of the second type electrodes is less than and equal to 0.5.

3. The display apparatus as claimed in claim 1, wherein the metal common electrodes comprise a plurality of first type metal common electrodes and a plurality of second type metal common electrodes, and a material of each of the first type metal common electrodes is different from a material of each of the second type metal common electrodes.

4. The display apparatus as claimed in claim 3, wherein the material of the first type metal common electrodes includes gold, germanium, nickel, or an alloy combining the foregoing materials, and the material of the second type metal common electrodes includes titanium, aluminum, or an alloy combining the foregoing materials.

5. The display apparatus as claimed in claim 4, wherein each of the light-emitting devices that the first type metal common electrodes are correspondingly in contact with has a first dominant light-emitting wavelength, each of the light-emitting devices that the second type metal common electrodes are correspondingly in contact with has a second dominant light-emitting wavelength, and the first dominant light-emitting wavelength is greater than the second dominant light-emitting wavelength.

6. The display apparatus as claimed in claim 5, wherein each of the light-emitting devices that the first type metal common electrodes are correspondingly in contact with is a red light emitting device, and each of the light-emitting devices that the second type metal common electrodes are correspondingly in contact with is a blue light emitting device or a green light emitting device.

7. The display apparatus as claimed in claim 1, further comprising:
    a plurality of bonding pads disposed on the driving substrate and located between the first type electrode of each of the light-emitting devices and the driving substrate.

8. The display apparatus as claimed in claim 7, further comprising:
   an insulation layer disposed on the driving substrate and covering the bonding pads and the epitaxial structure and the first type electrode of each of the light-emitting devices, the metal common electrodes covering on the insulation layer, wherein a thickness of the insulation layer is less than a thickness of each of the light-emitting devices.

9. The display apparatus as claimed in claim 1, wherein the epitaxial structure comprises a first type semiconductor layer, an light-emitting layer, and a second type semiconductor layer, the light-emitting layer is located between the first type semiconductor layer and the second type semiconductor layer, the first type electrode is electrically connected to the first type semiconductor layer, and the second type electrode is electrically connected to the second type semiconductor layer.

10. The display apparatus as claimed in claim 9, wherein the metal common electrodes cover one side surface of each of the light-emitting layers.

11. The display apparatus as claimed in claim 1, wherein each of the metal common electrodes has a first vertical height in vertical section, each of the metal common electrodes and the driving substrate have a second vertical height in vertical section, and a specific value of ratio of the first vertical height to the second vertical height is between 0.3 and 1.

12. The display apparatus as claimed in claim 1, wherein the metal common electrodes cover one side surface of each of the light-emitting devices.

13. The display apparatus as claimed in claim 1, wherein each of the metal common electrodes comprises a first metal common electrode and a second metal common electrode, and the first metal common electrode and the second metal common electrode respectively cover two side surfaces of each of the light-emitting devices.

14. The display apparatus as claimed in claim 1, wherein the metal common electrodes cover a surrounding of each of the light-emitting devices.

15. The display apparatus as claimed in claim 1, further comprising:
   a transparent conductive layer disposed on the metal common electrodes and covering at least the metal common electrodes and the light-emitting devices.

* * * * *